United States Patent [19]
Narita

[11] Patent Number: 5,307,310
[45] Date of Patent: Apr. 26, 1994

[54] SEMICONDUCTOR MEMORY HAVING STACKED CAPACITORS AND MOS TRANSISTORS

[75] Inventor: Kaoru Narita, Tokyo, Japan

[73] Assignee: NEC Corporation, Tokyo, Japan

[21] Appl. No.: 743,238

[22] Filed: Aug. 9, 1991

[30] Foreign Application Priority Data

Aug. 11, 1990 [JP] Japan .................................. 2-213238

[51] Int. Cl.⁵ ............................................ H01L 29/78
[52] U.S. Cl. ..................................... 365/149; 257/302; 257/303; 257/330; 257/908
[58] Field of Search ................. 365/149; 257/311, 302, 257/306, 296, 330, 908, 909, 911, 303

[56] References Cited

U.S. PATENT DOCUMENTS

| | | | |
|---|---|---|---|
| 4,716,548 | 12/1987 | Mochizwki | 257/311 |
| 4,833,516 | 3/1989 | Hwang et al. | 257/302 |
| 4,949,138 | 8/1990 | Nishimura | 365/149 X |
| 5,034,785 | 7/1991 | Blanchard | 257/330 |
| 5,100,823 | 3/1992 | Yamada | 257/302 |

*Primary Examiner*—Eugene R. LaRoche
*Assistant Examiner*—Son Dinh
*Attorney, Agent, or Firm*—Burns, Doane, Swecker & Mathis

[57] ABSTRACT

A dynamic random access memory comprises a p-type semiconductor substrate and a plurality of first n-type diffused regions embedded in the substrate so that they extend along a first axis of the substrate parallel with first and second, opposed major surfaces of the substrate to form parallel bit lines. A matrix array of insulated gate electrodes extend along a second axis of the substrate normal to the first axis from the first major surface into the first n-type diffused regions, so that those of the insulated gate electrodes which are arranged along rows of the matrix are connected together by the parallel bit lines. Second n-type diffused regions are embedded in the substrate adjacent to the first major surface as well as to corresponding ones of the insulated gate electrodes. Parallel conductors extend along a third axis of the substrate for electrically connecting those of the gate electrodes which are arranged along columns of the matrix array to respective word lines, the third axis being perpendicular to both of the first and second axes. Capacitors are stacked on the insulated gate electrodes, respectively. Each of the capacitors has a cell electrode coupled to one of the second n-type diffused regions, a common electrode and a charge storage layer interposed therebetween.

16 Claims, 5 Drawing Sheets

SEMICONDUCTOR MEMORY HAVING STACKED CAPACITORS AND MOS TRANSISTORS

BACKGROUND OF THE INVENTION

The present invention relates generally to metal-oxide semiconductor dynamic random-access memories, and more specifically to a one-transistor dynamic memory cell structure.

In a prior art one-transistor dynamic MOS memory, memory cells are defined on a major surface of a p-type silicon substrate 101, as shown in FIG. 1, by separator 102, and n+-type regions 106 are formed in the substrate to act as source and drain electrodes of a MOS structure. Insulators 103 are deposited on the substrate and a gate electrode 104 is formed on each insulator 103. A capacitor, which is formed in a first interlayer insulator 108 by a cell electrode 109, a tantalum oxide charge storage layer 111 and a common electrode 110, is located side-by-side with the gate insulator 103, while making an electrical contact with one of the n+ regions. The other n+-type region is coupled to the n+-type regions of other memory cells by a bit-line conductor 105 which is formed in the first and second interlayer insulators 108 and 112. On the bit line 105 is a third interlayer insulator 113 on which a wiring layer is formed.

Because of the side-by-side arrangement of the cell capacitors, gate electrodes and the contact portions of the bit line, it is difficult to reduce the horizontal dimensions of the memory without reducing the mechanical strength of the memory to withstand punch-through pressure. Another shortcoming of the prior art lies in the difficulty to provide a sufficient amount of storage capacity for each memory cell partly because an increased vertical dimension of the capacitors makes it difficult to machine contact holes for the bit line and partly because the heat-vulnerable tantalum oxide layers must be subjected to repeated annealing processes.

SUMMARY OF THE INVENTION

It is therefore an object of the present invention to provide a memory cell structure having reduced horizontal dimensions and a sufficient charge storage capacity.

According to the present invention, there is provided a semiconductor memory cell comprising a semiconductor substrate of first conductivity type. A first impurity-diffused region of second conductivity type opposite to the first conductivity type is embedded in the substrate and extends along a first axis of the substrate parallel with first and second, opposed major surfaces of the substrate. An insulated gate electrode is embedded in the substrate so that it extends along a second axis of the substrate from its first major surface into the first impurity-diffused region, the second axis being perpendicular to the first axis. A second impurity-diffused region of the second conductivity type is embedded in the substrate adjacent to the first major surface as well as to the insulated gate electrode. A capacitor is aligned along the second axis of the substrate with the insulated gate electrode. The capacitor has a first electrode electrically coupled to the second impurity-diffused region, a second electrode, and a charge storage layer interposed therebetween.

Because of the stacked capacitor and MOS transistor, the memory cell can be reduced in horizontal dimensions without sacrificing its mechanical strength and a sufficient amount of storage capacity is ensured.

According to another aspect of the present invention, a dynamic random access memory is provided which comprises a semiconductor substrate of first conductivity type and a plurality of first impurity-diffused regions of second conductivity type opposite to the first conductivity type, the first impurity-diffused regions being embedded in the substrate and extending along a first axis of the substrate parallel with first and second, opposed major surfaces of the substrate to form a plurality of parallel bit lines. A matrix array of insulated gate electrodes are embedded in the substrate. The insulated gate electrodes extend along a second axis of the substrate (which is normal to the first axis) from the first major surface into the first impurity-diffused regions, so that those of the insulated gate electrodes which are arranged along rows of the matrix array are connected together by the parallel bit lines. A plurality of second impurity-diffused regions of the second conductivity type are embedded in the substrate adjacent to the first major surface as well as to corresponding ones of the insulated gate electrodes. A plurality of parallel conductors extend along a third axis of the substrate for electrically connecting those of the gate electrodes which are arranged along columns of the matrix array to respective word lines, the third axis being perpendicular to both of the first and second axes. A plurality of capacitors are stacked on the insulated gate electrodes respectively, the capacitors having first, respective electrodes coupled to respective ones of the second impurity-diffused regions, a second, common electrode and a charge storage layer interposed therebetween.

BRIEF DESCRIPTION OF THE DRAWINGS

The present invention will be described in further detail with reference to the accompanying drawings, in which.

DETAILED DESCRIPTION

Figure 1:
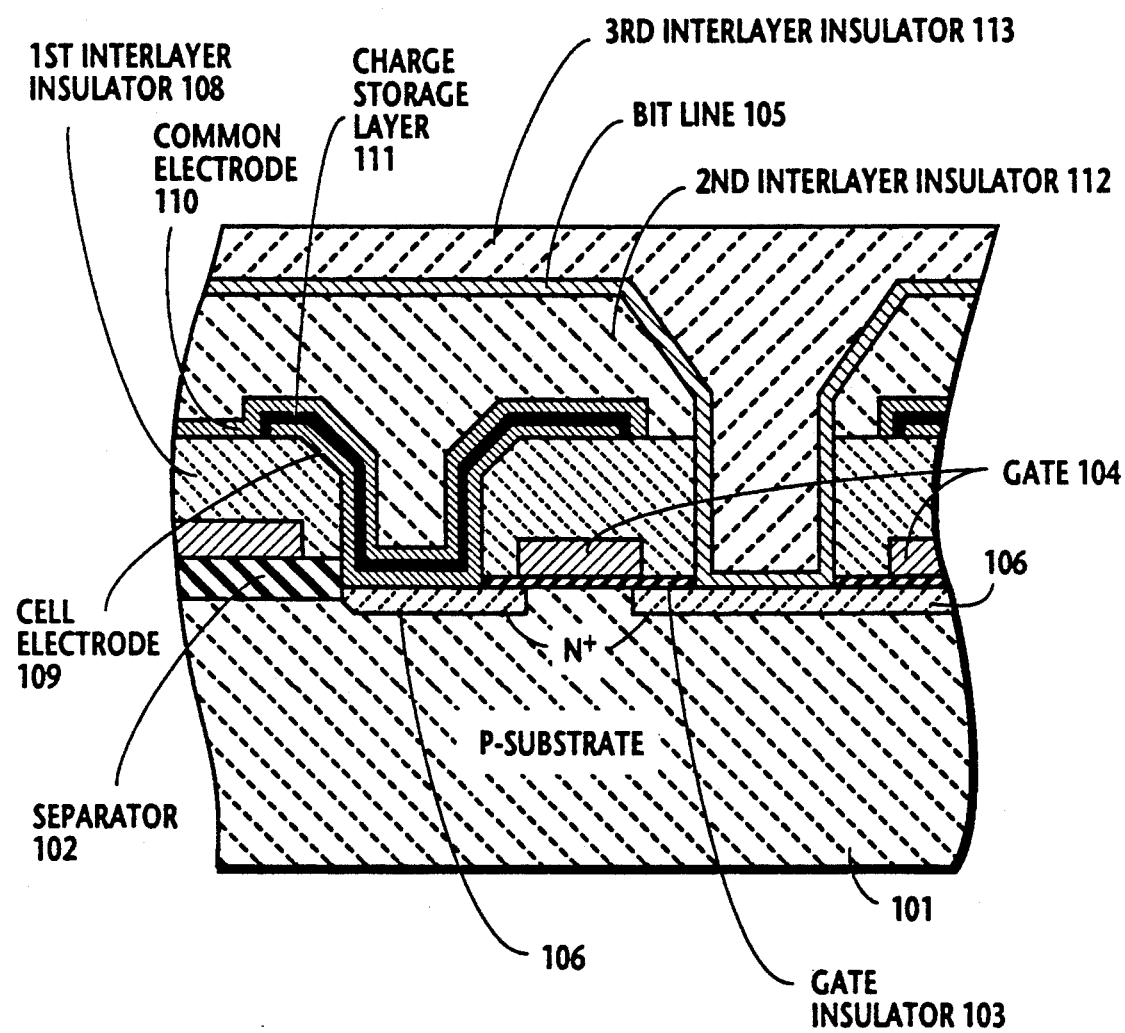
FIG. 1 is a vertical cross-sectional view of a prior art MOS memory cell structure.
Figure 2:
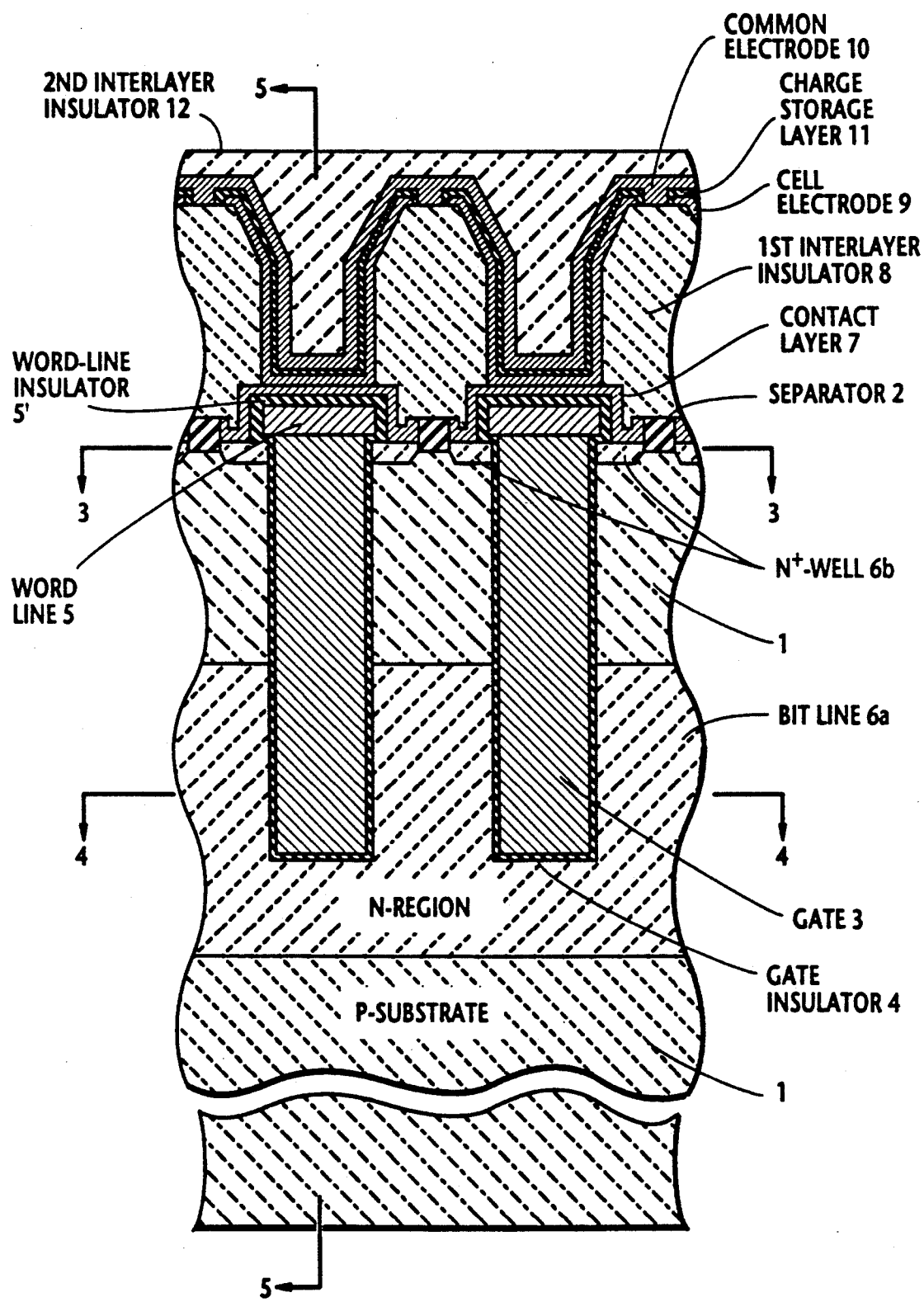
FIG. 2 is a vertical cross-sectional view of a MOS memory cell structure of the present invention.
Figure 4:
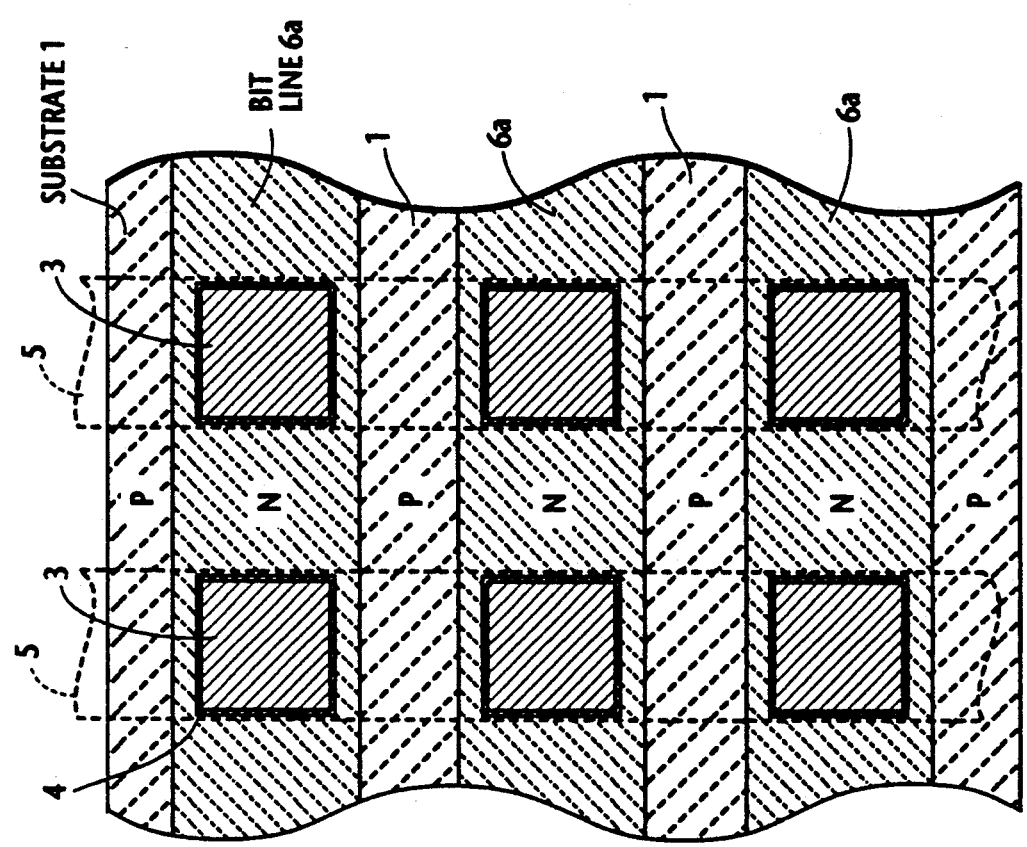
FIGS. 3, 4 and 5 are cross-sectional views taken along the lines 3—3, 4—4 and 5—5 of FIG. 2, respectively.
Figure 3:
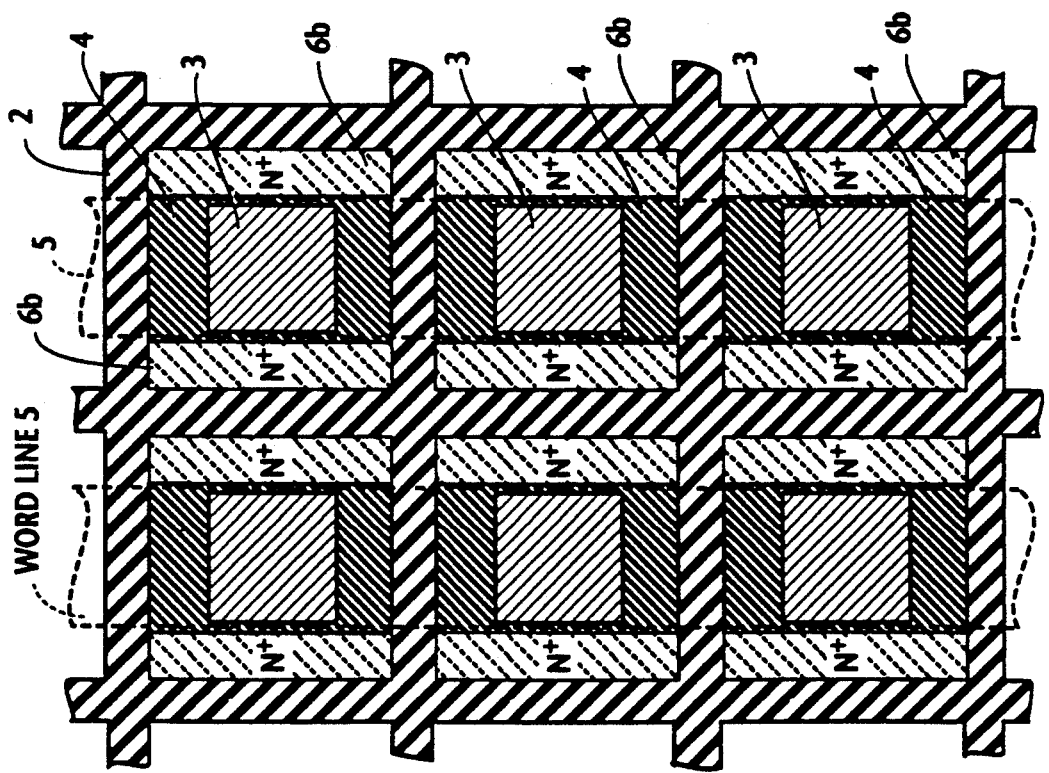
Figure 5:
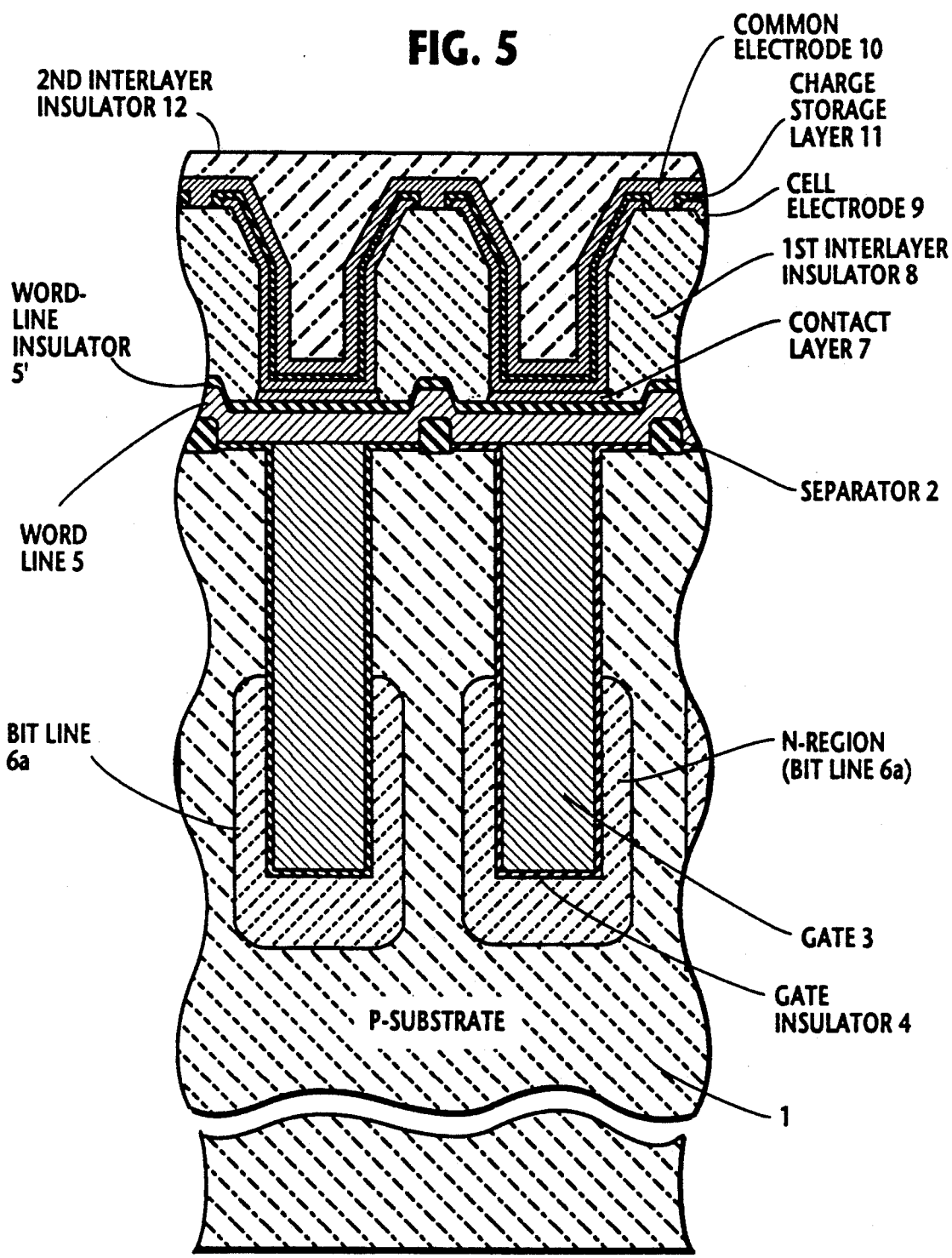

In FIGS. 2–5, a MOS dynamic random-access memory of the present invention is constructed of a p-type semiconductor substrate 1. As clearly shown in FIG. 3, an insulative separator 2 having a pattern of rows and columns is formed on the p-type substrate 1 to define a 1 $\mu$m × 1 $\mu$m active region for each memory cell. Each memory cell uses only one transistor and comprises a gate electrode 3 of a square horizontal cross-section that extends from the upper surface of the substrate to a depth of approximately 2 $\mu$m. Each gate electrode 3 is isolated by an insulator 4 from the surrounding substrate. The upper ends of gate electrodes 3 are coupled together by parallel word lines 5 which extend horizontally across the upper surface of the substrate 1 as seen from FIGS. 3–5. Word lines 5 are enclosed and isolated by insulators 5' from surrounding elements.

N-type diffused regions 6a are formed in parallel with each other in the midst of the p-type substrate such that the lower half section of each gate electrode 3 is embedded in one of the n-type regions 6a. Each n-type region 6a acts as a source (or drain) of the MOS structure of each memory cell as well as a bit line of the random-access memory. As clearly shown in FIG. 3, each memory cell has an n+-type diffused well 6b which surrounds the upper end portion of the insulated gate electrode 3 to act as a drain (or source) of the MOS structure. For each cell structure there is provided a cell electrode 9 that is brought into electrical contact with the n+-type well 6b by way of a contact layer 7. The cell electrode 9 of each memory cell has a generally U-shaped vertical cross-section with the bottom of the U being in contact with the contact layer 7 of the cell. To provide a capacitor for each memory cell, a charge storage layer 11 is formed on the inner walls of the capacitor electrode 9 of the cell and a common electrode 10 is formed over the charge storage layers 11 of all memory cells. The inner and outer sides of all capacitors are respectively filled with insulative materials, forming first and second interlayer insulators 8 and 12. An aluminum wiring layer, not shown, is formed on the upper surface of insulator 12.

Figure 6:
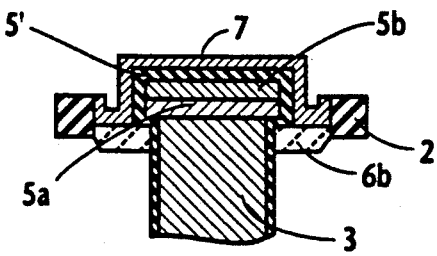
FIG. 6 is a cross-sectional view of a modified MOS memory cell structure of this invention.

As shown in FIG. 6, word lines 5 are preferably formed of laminates of polysilicon underlying layer 5a and an upper layer 5b of high-melting point metallic silicide. The effect of this configuration is to advantageously reduce the resistivity of the word lines for high speed memory operation.

Bit lines 6a are coupled to sense amplifiers, not shown, to write data into and read it from the memory by selecting one of the word lines 5 in a well known manner.

The following is a description of process steps with which the memory of the present invention is manufactured.

Figure 7A:
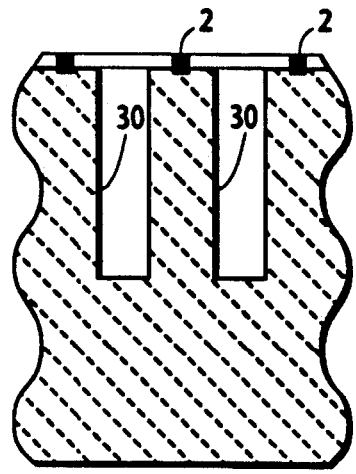
FIGS. 7a to 7h are views illustrating process steps for fabricating a MOS random-access memory of the present invention.
Figure 7B:
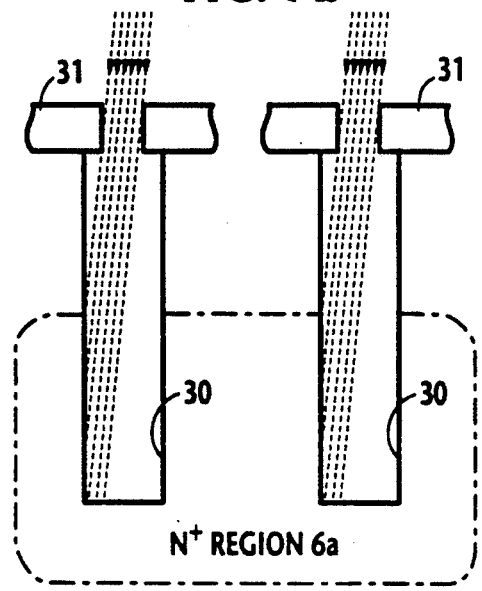
Figure 7C:
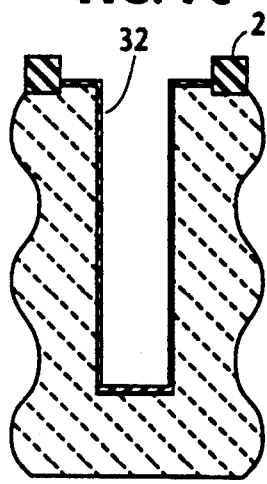
Figure 7D:
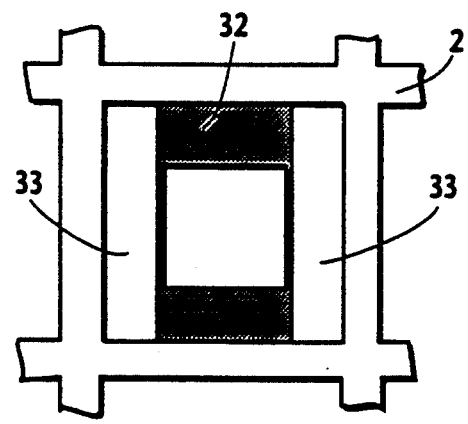
Figure 7E:
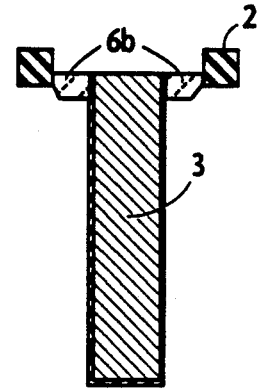
Figure 7F:
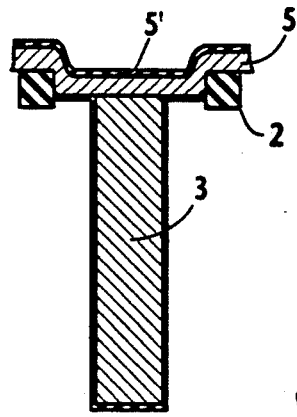
Figure 7G:
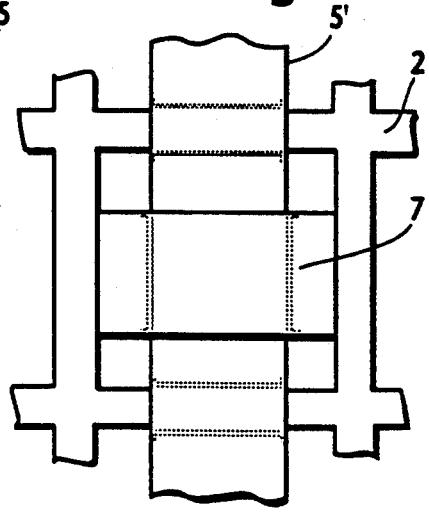
Figure 7H:
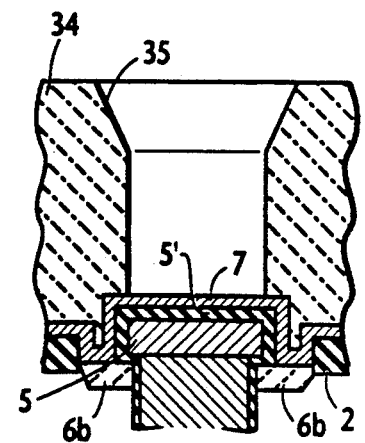

As shown in FIG. 7a, separator 2 is first formed on a p-type silicon substrate 1 to define a plurality of 1 $\mu m \times 1$ $\mu m$ active regions on the surface of the substrate. The surface of the substrate is then etched to form a hole 30 in each active region to a depth of 2 $\mu m$ with a horizontal cross-sectional area measuring 0.5 $\mu m \times 0.5$ $\mu m$. A photoresist 31 (FIG. 7b) is positioned so that it overhangs the opening of each hole 30. Using an ion-implanting technique, n-type impurities are then injected through the photoresist 31 in a direction skewed relative to the vertical and the source of impurities is rotated 360 degrees so that portions of the p-type substrate 1 surrounding the lower half section of the hole 30 are doped with n-type impurities. The ion implantation process is then followed by an annealing process in which the substrate is subjected to heat to cause the injected impurities to diffuse into the substrate, creating the n-type regions 6a having an impurity concentration of $10^{18}/cm^3$. A heat oxidation process then follows to form a gate insulation layer 32 on the side and bottom walls of the hole 30 and over the upper surface of the active region. Portions of the insulation layer 32 on the upper surface are etched to leave an opening 33 on each side of the insulated gate 3 (FIG. 7d). Arsenide is ion-implanted to a concentration of $10^{19}/cm^3$ into the p-type substrate through openings 33 to create the n+-type wells 6b. The gate electrodes 3 are formed by filling the insulator-covered holes with phosphor-containing polysilicon (FIG. 7e), followed by deposition of a polysilicon layer over the substrate and etching the polysilicon layer to form the word lines 5 (FIG. 7f) which is then covered with the insulative layer 5'. A polysilicon layer is then deposited and subsequently etched to form the contact layer 7 for each memory cell so that it provides an electrical contact across the n+-type wells 6b of the cell (FIG. 7g). Chemical vapor deposition (CVD) technique is then used to deposit a silicon dioxide layer 34 over the surface of the memory. For each memory cell, a hole 35 is created in the silicon dioxide layer 34, extending to the contact layer 7 of the cell (FIG. 7h). Polysilicon is deposited and then etched to create the cell electrode 9, followed by deposition of tantalum oxide to create the charge storage layer 11 and subsequent deposition of polysilicon to form the common electrode 10. Finally, silicon dioxide is deposited to form the second interlayer insulator 12.

The following advantages result from the capacitor-MOS stacked structure of the present invention:

(1) Since the n-type source (or drain) region of each MOS transistor is embedded deeply in the p-type substrate, allowing the gate electrode 3 to extend vertically into that source (or drain) region, the MOS and capacitor can be stacked one upon the other. Thus, the horizontal dimensions of the memory are reduced significantly in comparison with the prior art MOS random-access memory without losing the strength to withstand punch-through pressure.

(2) Since the surface configuration of the memory is relatively simplified due to the elimination of the prior art third interlayer insulator, ease of manufacture can be ensured even though its horizontal dimensions are reduced in comparison with the prior art.

(3) Since the vertical dimension of the capacitor structure can be increased without increasing its horizontal dimensions, the amount of charges that can be stored in each memory cell can be sufficiently increased to provide high-voltage outputs.

(4) Following the formation of the capacitor structure, the memory is not exposed to as many annealing processes as involved in the process of the prior art memory. Thus, heat-vulnerable tantalum oxide, which is used for storing charges, is not adversely affected by the annealing processes and advantageously exhibits time-invariant characteristics for a long period of use.

The foregoing description shows only one preferred embodiment of the present invention. Various modifications are apparent to those skilled in the art without departing from the scope of the present invention which is only limited by the appended claims. Therefore, the embodiment shown and described is only illustrative, not restrictive.

What is claimed is:

1. A semiconductor memory cell comprising:
   a semiconductor substrate of a first conductivity type, the substrate having a pair of opposed first and second major surfaces;
   a first impurity-diffused region of a second conductivity type opposite to said first conductivity type, the first impurity-diffused region being embedded in the substrate and extending along a first axis of the substrate parallel with said first and second major surfaces;
   an insulated gate electrode embedded in said substrate, the insulated gate electrode extending along a second axis of the substrate from said first major surface into said first impurity-diffused region, said second axis being perpendicular to said first axis;

a second impurity-diffused region of said second conductivity type embedded in said substrate adjacent to said first major surface and adjacent to the insulated gate electrode; and a capacitor stacked on the insulated gate electrode, the capacitor having a first electrode electrically coupled to the second impurity-diffused region, a second electrode and a charge storage layer interposed therebetween.

2. A semiconductor memory cell as claimed in claim 1, wherein said capacitor has a generally U-shaped cross-section along the second axis of the substrate.

3. A semiconductor memory cell as claimed in claim 1 or 2, wherein said insulated gate electrode has a square cross-section along the first axis of the substrate.

4. A semiconductor memory comprising:
a semiconductor substrate of a first conductivity type, the substrate having a pair of opposed first and second major surfaces;
a plurality of memory cells, each of the cells comprising:
a first impurity-diffused region of a second conductivity type opposite to said first conductivity type, the first impurity-diffused region being embedded in the substrate and extending along a first axis of the substrate parallel with said first and second major surfaces, the first impurity-diffused region of each memory cell being connected to the first impurity-diffused regions of other memory cells to form a bit line;
an insulated gate electrode embedded in said substrate, the insulated gate electrode extending along a second axis of the substrate from said first major surface into said first impurity-diffused region, said second axis being perpendicular to said first axis, whereby the insulated gate electrodes of the memory cells are partially embedded in said bit line;
a second impurity-diffused region of said second conductivity type embedded in said substrate adjacent to said first major surface and adjacent to the insulated gate electrode; and
a capacitor stacked on the insulated gate electrode, the capacitor having a first electrode electrically coupled to the second impurity-diffused region, a common electrode coupled to a common electrode of other memory cells and a change storage layer interposed therebetween, and
a plurality of conductors electrically connected to the gate electrodes of the memory cells, respectively, to form a plurality of word lines.

5. A semiconductor memory as claimed in claim 4, wherein said capacitor has a generally U-shaped cross-section along the second axis of the substrate.

6. A semiconductor memory as claimed in claim 4 or 5, wherein said insulated gate electrode has a square cross-section along the first axis of the substrate.

7. A semiconductor memory comprising:
a semiconductor substrate of a first conductivity type, the substrate having a pair of opposed first and second major surfaces;
a plurality of memory cells, each of the cells comprising:
a first impurity-diffused region of a second conductivity type opposite to said first conductivity type, the first impurity-diffused region being embedded in the substrate and extending along a first axis of the substrate parallel with said first and second major surfaces;
an insulated gate electrode embedded in said substrate, the insulated gate electrode extending along a second axis of the substrate from said first major surface into said first impurity-diffused region, said second axis being perpendicular to said first axis;
a second impurity-diffused region of said second conductivity type embedded in said substrate adjacent to said first major surface and adjacent to the insulated gate electrode; and
a capacitor stacked on the insulated gate electrode, the capacitor having a first electrode electrically coupled to the second impurity-diffused region, a common electrode coupled to the common electrode of other memory cells and a charge storage layer interposed therebetween, and
a conductor extending along a third axis of the substrate for electrically connecting the gate electrodes of the memory cells to a word line, said third axis being perpendicular to both of said first and second axes.

8. A semiconductor memory as claimed in claim 7, wherein said conductor is formed of an underlying layer of polysilicon and an overlying layer of high-melting point metallic silicide.

9. A semiconductor memory as claimed in claim 7, wherein said capacitor has a generally U-shaped cross-section along the second axis of the substrate.

10. A semiconductor memory as claimed in claim 7 or 9, wherein said insulated gate electrode has a square cross-section along the first axis of the substrate.

11. A dynamic random access memory comprising:
a semiconductor substrate of a first conductivity type, the substrate having a pair of opposed first and second major surfaces;
a plurality of first impurity-diffused regions of a second conductivity type opposite to said first conductivity type, the first impurity-diffused regions being embedded in the substrate and extending along a first axis of the substrate parallel with said first and second major surfaces to form a plurality of parallel bit lines;
a matrix array of insulated gate electrodes embedded in said substrate, the insulated gate electrodes extending along a second axis of the substrate from said first major surface into said first impurity-diffused regions, so that those of the insulated gate electrodes which are arranged along rows of the matrix array are connected together by said parallel bit lines, said second axis being perpendicular to said first axis;
a plurality of second impurity-diffused regions of said second conductivity type embedded in said substrate adjacent to said first major surface and adjacent to corresponding ones of the insulated gate electrodes;
a plurality of parallel conductors extending along a third axis of the substrate for electrically connecting those of the gate electrodes which are arranged along columns of the matrix array to respective word lines, said third axis being perpendicular to both of said first and second axes; and
a plurality of capacitors respectively stacked on the insulated gate electrodes, the capacitors having first, respective electrodes electrically connected to respective ones of the second impurity-diffused regions, a second, common electrode, and a charge storage layer interposed therebetween.

12. A dynamic random access memory as claimed in claim 11, wherein each of said conductors is formed of an underlying layer of polysilicon and an overlying layer of high-melting point metallic silicide.

13. A dynamic random access memory as claimed in claim 11, wherein each of said capacitors has a generally U-shaped cross-section along the second axis of the substrate.

14. A dynamic random access memory cell as claimed in claim 11 or 13, wherein each of said insulated gate electrodes has a square cross-section along the first axis of the substrate.

15. A dynamic random access memory cell as claimed in claim 11, wherein each of said capacitors includes a tantalum oxide layer interposed between the first and second electrodes of the capacitor.

16. A dynamic random access memory cell as claimed in claim 11, further comprising a plurality of contact layers for establishing electrical contacts between said first electrodes of the capacitors and respective ones of the second impurity-diffused regions.

* * * * *